US008612197B1

(12) United States Patent
Johnson et al.

(10) Patent No.: US 8,612,197 B1
(45) Date of Patent: Dec. 17, 2013

(54) LARGE SCALE SIMULATION ARCHITECTURE FOR DISTRIBUTED NETWORKING WAVEFORMS

(75) Inventors: Jeffrey D. Johnson, Sachse, TX (US); Alan D. Amis, Plano, TX (US); George A. Deprez, Parker, TX (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 477 days.

(21) Appl. No.: 12/960,876

(22) Filed: Dec. 6, 2010

(51) Int. Cl.
*G06F 17/50* (2006.01)
*G06G 7/62* (2006.01)

(52) U.S. Cl.
CPC ........ *G06F 17/5022* (2013.01); *G06F 17/5036* (2013.01)
USPC .......................................................... 703/13

(58) Field of Classification Search
USPC ............................................. 703/13, 17, 23
See application file for complete search history.

(56) References Cited

U.S. PATENT DOCUMENTS 6,134,514 A * 10/2000 Liu et al. ......................... 703/17
6,832,184 B1 * 12/2004 Bleier et al. .................... 703/23
7,031,895 B1 * 4/2006 Takahashi et al. .............. 703/13

OTHER PUBLICATIONS

ONPETWORK2002 ("Introduction to Using OPNET Modeler"), 2002, 50 Pages.*

* cited by examiner

*Primary Examiner* — Eunhee Kim
(74) *Attorney, Agent, or Firm* — Donna P. Suchy; Daniel M. Barbieri

(57) ABSTRACT

A system for providing a network simulation is disclosed. The system may comprise a plurality of simulation platforms, each particular simulation platform of the plurality of simulation platforms representing a simulated entity in the network simulation, each particular simulation platform may include: a simulated node configured for executing a set of networking software for representing the simulated entity; a communication handler configured for handling communications between the particular simulation platform and another simulation platform of the plurality of simulation platforms; and a proxy node configured for emulating a data transmission from an outside node to the simulated node, the outside node being a simulated node of the other simulation platform. The system may further comprise a simulation control module for controlling at least one of: a start and an end of the network simulation, mobility of each of the plurality of simulation platforms, and traffic flows in the network simulation.

15 Claims, 3 Drawing Sheets

LARGE SCALE SIMULATION ARCHITECTURE FOR DISTRIBUTED NETWORKING WAVEFORMS

GOVERNMENT LICENSE RIGHTS

The U.S. Government has a paid-up license in this invention and the right in limited circumstances to require the patent owner to license others on reasonable terms as provided for by the terms of Government Contract No. FA8650-06-D-7636 awarded by the United States Air Force.

TECHNICAL FIELD

The present disclosure relates generally to simulation architectures and more particularly to a large scale simulation architecture for distributed networking waveforms.

BACKGROUND

Modeling and simulation (M&S) refers to the use of models, including emulators, prototypes, simulators, and stimulators, either statically or over time, to develop data as a basis for making managerial or technical decisions. Network simulation is a technique where a simulation system models the behavior of a network by calculating/emulating interactions between different network entities/nodes. A network simulator is a piece of software or hardware that simulates/predicts the behavior of a network.

SUMMARY

The present disclosure is directed to a system for providing a network simulation. The system may comprise a plurality of simulation platforms, each particular simulation platform of the plurality of simulation platforms representing a simulated entity in the network simulation, each particular simulation platform may include: a simulated node configured for executing a set of networking software for representing the simulated entity; a communication handler configured for handling communications between the particular simulation platform and another simulation platform of the plurality of simulation platforms; and a proxy node configured for emulating a data transmission from an outside node to the simulated node, the outside node being a simulated node of the other simulation platform. The system may further comprise a mobility controller configured for controlling mobility of each of the plurality of simulation platforms; a traffic generator configured for generating traffic flows in the network simulation; and a user interface for controlling at least one of a start and an end of the network simulation, and for configuring at least one of the mobility controller and the traffic generator.

A further embodiment of the present disclosure is directed to a system for providing a network simulation. The system may comprise a plurality of simulation platforms, each particular simulation platform of the plurality of simulation platforms representing a simulated entity in the network simulation, each particular simulation platform may include: a simulated node configured for executing a set of networking software for representing the simulated entity; a communication handler configured for handling communications between the particular simulation platform and another simulation platform of the plurality of simulation platforms; and a proxy node configured for emulating a data transmission from an outside node to the simulated node, the outside node being a simulated node of the other simulation platform. The system may further comprise a simulation control module configured for controlling at least one of: a start and an end of the network simulation, mobility of each of the plurality of simulation platforms, and traffic flows in the network simulation.

An additional embodiment of the present disclosure is directed to a simulation platform hosted on a computing device, the simulation platform representing an entity in a network simulation. The simulation platform may comprise a simulated node, the simulated node configured for executing a set of networking software for representing the entity in the network simulation; a communication handler, the communication handler configured for handling communications between the simulation platform and another simulation platform in the network simulation; and a proxy node, the proxy node configured for emulating a data transmission from the other simulation platform to the simulated node; wherein the simulated node comprises a receiver model, the proxy node comprises a transmitter model, and the simulated node only receives network communications via the proxy node.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION

Reference will now be made in detail to exemplary embodiments of the disclosure, examples of which are illustrated in the accompanying drawings.

Figure 1:
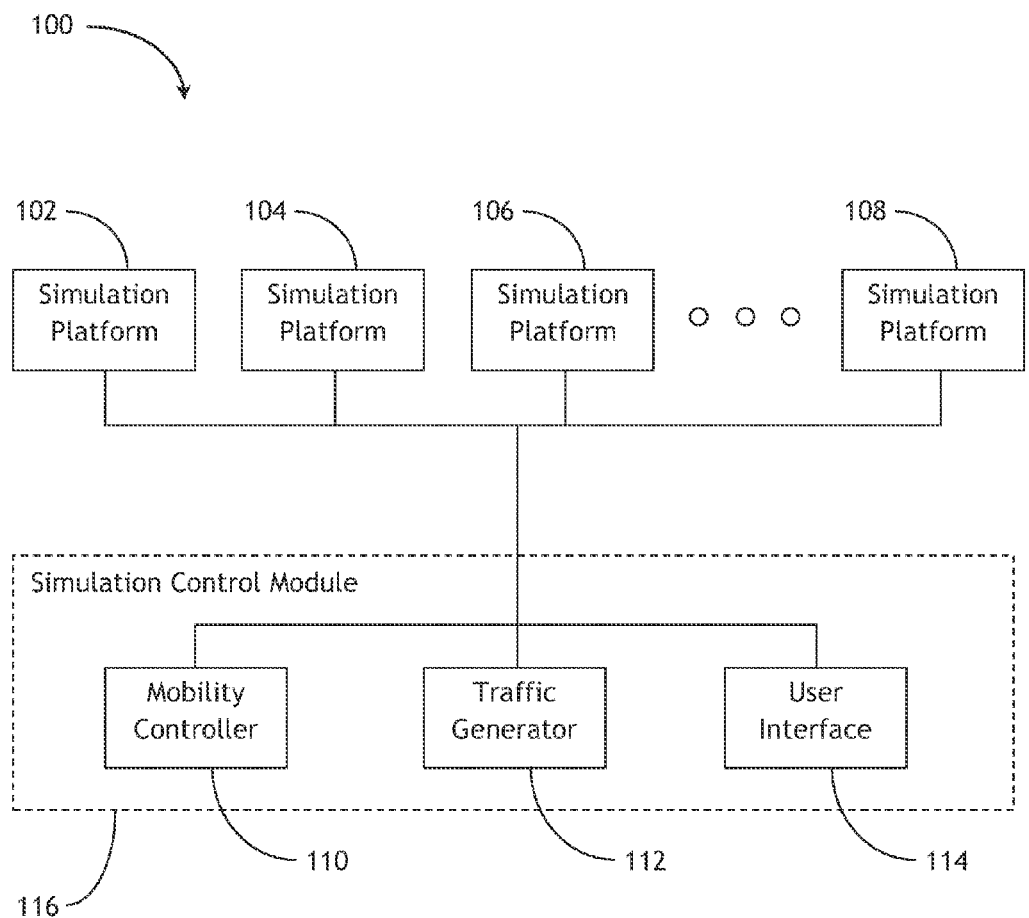
FIG. 1 is a block diagram illustrating a system/architecture for providing a network simulation.

Referring to FIG. 1, a block diagram illustrating a system/architecture 100 for providing a network simulation is shown. The system 100 may include multiple simulation platforms 102 through 108, each representing a simulated entity/device in the simulated environment. Each simulation platform may function independently with respect to each other in a manner similar to that of a real world communication device (e.g., a radio, a mobile communication device or the like). It is understood that the number of simulation platforms depicted is merely exemplary. The specific number of simulation platforms may vary without departing from the spirit and scope of the present disclosure.

One or more computing devices (e.g., computers, processors, blades or the like) may be utilized to host the simulation platforms. The number of computing devices utilized for hosting the simulation platforms may be determined at least partially based on the resources available and/or the simulation requirements. For example, if a fast simulation completion time is required, then a dedicated computing device may be allocated for hosting each of the simulation platforms. However, if the resources are limited, then one computing device may be configured for hosting two or more simulation platforms. It is understood that when two or more simulation platforms are hosted on the same computing device, certain resources of that computing device may be shared (e.g., processor, memory or the like), but the simulation platforms themselves may still function independently with respect to each other.

The system 100 may also include a mobility controller 110 for controlling the mobility of the simulation platforms 102 through 108 (representing mobility of the corresponding devices in the simulated environment). For example, the mobility controller 110 may initialize the spatial/locational data associated with each simulation platforms. Furthermore, the mobility controller 110 may update the spatial/locational data associated with a particular simulation platform to simulate a movement of the corresponding device in the simulated environment.

The system 100 may further include a traffic generator 112 for generating traffic flows in the simulated environment. For example, the traffic generator 112 may generate different traffic loads based on the time of the day, the day of the week or other time based conditions. The traffic generator 112 may also generate different traffic loads based on the types of devices represented by the simulation platforms. For instance, a simulated end-user device may have a relatively lighter traffic load compared to a simulated network hub device.

Furthermore, the system 100 may include a user interface 114 for controlling the start and the end of the simulation. The user interface 114 may also allow the user to configure the mobility controller 110 and/or the traffic generator 112. It is contemplated that the user interface 114 may be implemented as a graphical or a command-line based interface.

In one embodiment, the mobility controller 110, the traffic generator 112 and the user interface 114 may be referred to as a simulation control module 116, and may be hosted on a computing device that is communicatively connected to the simulation platforms 102 through 108. Alternatively, the mobility controller 110, the traffic generator 112 and the user interface 114 may be hosted on a distributed system having multiple computing devices that are communicatively connected to the simulation platforms 102 through 108. It is understood that the communications between the computing devices may be established via a Local Area Network (LAN). However, other types of data communication technologies (e.g., Wide Area Networks, wireless network technologies or the like) may be utilized without departing from the spirit and scope of the present disclosure.

Each of the simulation platforms 102 through 108 may operate within a network simulator (e.g., OPNET Modeler or the like). The network simulator may allow for a code-shared approach wherein the deployed software can be used within the distributed M&S environment. Such configurations may address scalability issues within the network simulator as well as mitigates the need for a behavioral model. It may be appreciated that code-shared models may provide higher fidelity, greater confidence and allow for faster, more efficient, lower cost waveform development.

Figure 2:
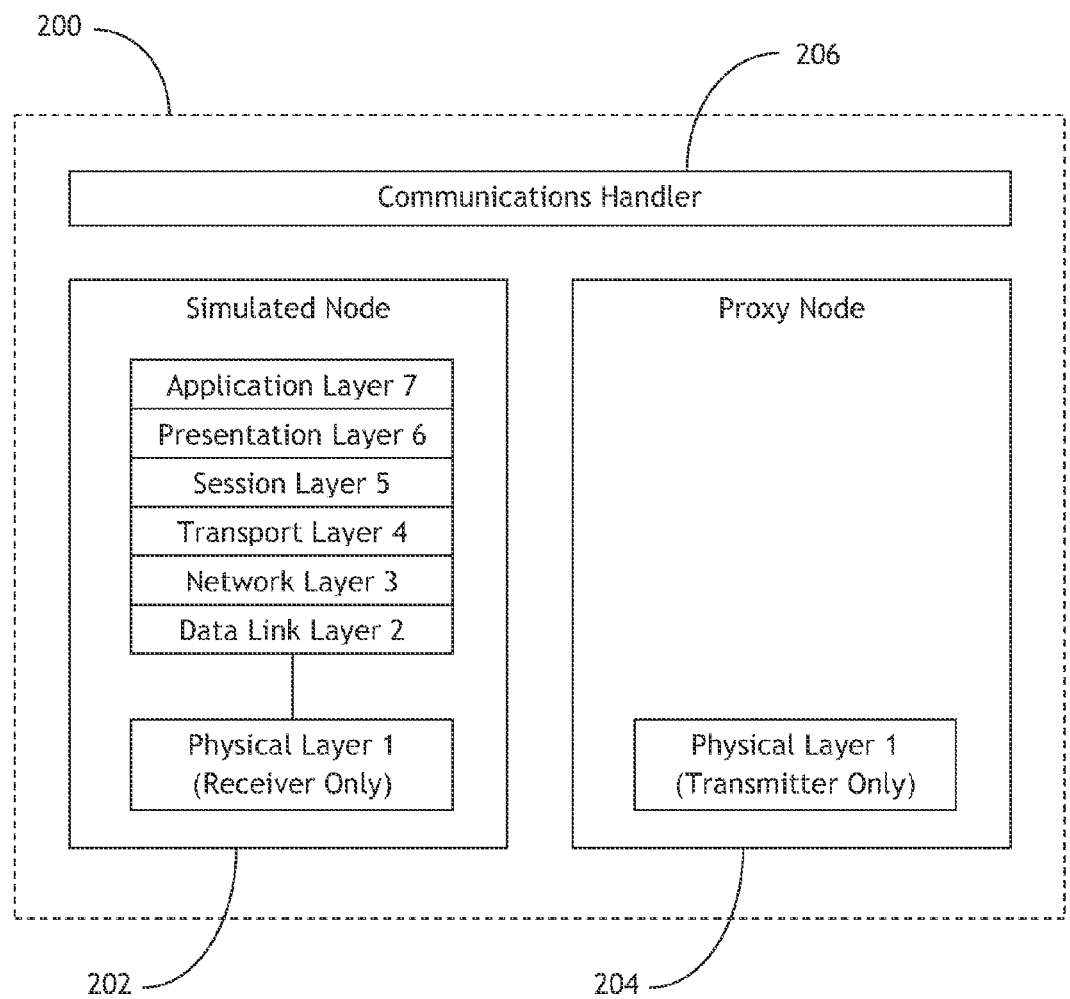
FIG. 2 is a block diagram illustrating a simulation platform.

Referring to FIG. 2, a block diagram illustrating a simulation platform 200 is shown. In one embodiment, each simulation platform 200 may include a simulated node 202 and a proxy node 204. The simulated node 202 may be configured for executing a set of software for representing the device/entity that is being simulated. The proxy node 204 may be configured for emulating a data transmission from an outside node to the simulated node 202, where the outside node is the simulated node of another simulation platform. The simulation platform 200 may further include a communication handler 206 configured for routing data packets in and out of the simulation platform 200, and facilitating data communications with other simulation platforms. In one embodiment, High Level Architecture (HLA) may be utilized to facilitate data communications among the simulation platforms. It is contemplated that other communication mechanisms may also be utilized.

In one implementation, the simulated node 202 may implement the Open Systems Interconnection model (OSI model) and include an entire networking stack from layer seven to layer one. The simulated node layers seven through two may be configured to execute/utilize the actual real-world networking software that is utilized by the device being simulated. This may be realized by abstracting the Real Time Operating System (RTOS) on which the networking software runs, allowing the networking software to execute in the network simulator (e.g., OPNET Modeler or the like). The ability to utilize the actual real-world networking software in the simulated environment may provide a higher fidelity simulation model.

It is understood, however, that utilizing the actual real-world networking software is not a requirement. That is, certain simulated node layers may utilize networking software that is reduced and/or optimized for simulation purposes. The specific networking software being utilized in the simulated node 202 is configurable by the user, and may be determined based on simulation requirements (e.g., completion time, fidelity level requirements or the like).

In one implementation, the simulated node layer one may implement a physical layer receiver model. The proxy node 204 in the same simulation platform 200 may implement a physical layer transmitter model. In this manner, the simulated node 202 may only receive network communications via transmissions from the proxy node 204, allowing the proxy node 204 to emulate transmissions from other nodes residing outside the simulation platform 200.

Figure 3:
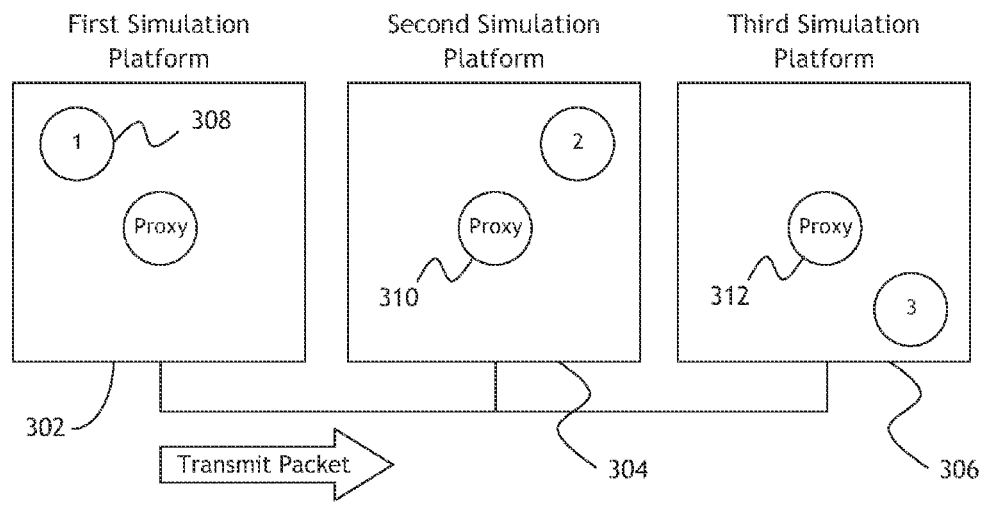
FIG. 3 illustrates network communications from a first simulation platform to a second simulation platform and a third simulation platform.
Figure 4:
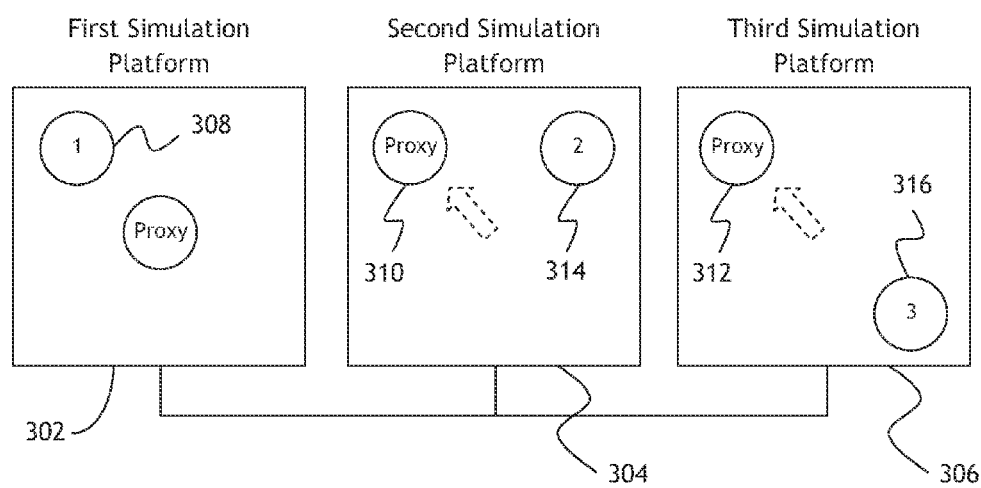
FIG. 4 illustrates receiving network communications at the second simulation platform and the third simulation platform, wherein the positions of the proxy nodes in the second simulation platform and the third simulation platform are adjusted accordingly.

FIGS. 3 and 4 illustrate network communications from a first simulation platform 302 to a second simulation platform 304 and a third simulation platform 306. Network communications originated from the first simulation platform 302 may occur as transmission packets exit layer two at the simulated node 308. Such transmission packets may be serialized and converted to a stream of raw bytes (e.g., 512-byte packets) for transfer over a communication mechanism. In one implementation, spatial parameters (e.g., x, y and z coordinates) of the simulated node 308 at the time of transmission may also be specified in the transmission packets. The spatial parameters of the simulated node 308 may provide the geographical location of the device represented by the first simulation platform 302 in the simulated environment.

Once the transmitted packets from the first simulation platform 302 are received (e.g., at the communication handlers of the second and third simulation platforms), the second simulation platform 304 and the third simulation platform 306 may move their respective proxy nodes 310 and 312 to the location of the simulated node 308 (as illustrated in FIG. 4). The locations of the proxy nodes 310 and 312 may be moved by setting their corresponding spatial parameters (e.g., x, y and z coordinates) based on the spatial parameters of the simulated node 308. In this manner, the network simulator that the second simulation platform 304 is operated within may take into account the relative positions of the proxy node 310 and the simulated node 314, allowing the proxy node 310 to emulate transmissions from the simulated node 308 to the simulated node 314. Proxy node 312 may emulate transmissions from the simulated node 308 to the simulated node 316 in the similar manner.

The system/architecture of the present disclosure may allow interferences to be modeled with the network distributed across multiple platforms. Each node may be set to run at the same rate with respect to real time. When overlapping transmissions are set to occur, the transmissions may be queued and the proxy node may perform the queued operations without advancing the simulation clock time. The rate at which the simulation platforms are executed may be proportional to the network connection speed and platform processor speed and inversely proportional to the number of nodes network wide and amount of simulated traffic.

Furthermore, the system/architecture of the present disclosure may reduce the amount of information transmitted between the simulation platforms. Each simulation platform is self-contained and utilizes its own proxy node to emulate transmissions from other nodes. In addition, the simulation network provided by the simulation platforms of the present disclosure is modular and scalable. Simulation platforms may be added to or removed from the simulation network without any significant impact on the rest of the simulation platforms, allowing the system/architecture of the present disclosure to be utilized for large scale simulations. Such large scale simulations may be carried out at a rate approaching real time, depending on the amount of resources available. For example, if one dedicated computer is allocated for each simulation platform in the simulation network, the simulation completion time may be comparable to the amount of time of the actual mission/condition that is being simulated.

It is understood that the present disclosure is not limited to any underlying implementing technology. The present disclosure may be implemented utilizing any combination of software and hardware technology. The present disclosure may be implemented using a variety of technologies without departing from the scope and spirit of the invention or without sacrificing all of its material advantages.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present disclosure and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system for providing a network simulation, the system comprising:
   at least one computing device configured for hosting a plurality of simulation platforms, each particular simulation platform of the plurality of simulation platforms representing a simulated entity in the network simulation, each particular simulation platform further comprising:
      a simulated node configured for executing a set of networking software for representing the simulated entity;
      a communication handler configured for handling communications between the particular simulation platform and another simulation platform of the plurality of simulation platforms; and
      a proxy node configured for emulating a data transmission from an outside node to the simulated node, the outside node being a simulated node of the other simulation platform, wherein communications from the other simulation platform to said particular simulation platform comprises spatial parameters of said outside node, and wherein spatial parameters of the proxy node of said particular simulation platform is adjusted based on the spatial parameters of said outside node to emulate the data transmission from said outside node to the simulated node of said particular simulation platform;
   a mobility controller configured for controlling mobility of each of the plurality of simulation platforms;
   a traffic generator configured for generating traffic flows in the network simulation; and
   a user interface for controlling at least one of a start and an end of the network simulation, and for configuring at least one of the mobility controller and the traffic generator.

2. The system of claim 1, wherein the simulated node of each particular simulation platform comprises a receiver model, the proxy node of each particular simulation platform comprises a transmitter model, and the simulated node of each particular simulation platform only receives network communications via the proxy node of the particular simulation platform.

3. The system of claim 2, wherein the simulated node of each particular simulation platform implements an Open Systems Interconnection (OSI) model, the OSI model having layers one through seven, layer one of the OSI model being a physical layer receiver model.

4. The system of claim 3, wherein layers two through seven of the OSI model are configurable for executing a set of actual real-world networking software of the simulated entity represented by the particular simulation platform.

5. The system of claim 1, wherein each of the plurality of simulation platforms operates within a network simulator, and the plurality of simulation platforms are hosted on at least one computing device.

6. A system for providing a network simulation, the system comprising:
   at least one computing device configured for hosting a plurality of simulation platforms, each particular simulation platform of the plurality of simulation platforms representing a simulated entity in the network simulation, each particular simulation platform further comprising:
      a simulated node configured for executing a set of networking software for representing the simulated entity;
      a communication handler configured for handling communications between the particular simulation platform and another simulation platform of the plurality of simulation platforms; and
      a proxy node configured for emulating a data transmission from an outside node to the simulated node, the outside node being a simulated node of the other simulation platform, wherein communications from the other simulation platform to said particular simulation platform comprises spatial parameters of said outside node, and wherein spatial parameters of the proxy node of said particular simulation platform is adjusted based on the spatial parameters of said outside node to emulate the data transmission from said outside node to the simulated node of said particular simulation platform; and a simulation control module configured for controlling at least one of a start and an end of the network simulation.

7. The system of claim 6, wherein the simulated node of each particular simulation platform comprises a receiver model, the proxy node of each particular simulation platform comprises a transmitter model, and the simulated node of each particular simulation platform only receives network communications via the proxy node of the particular simulation platform.

8. The system of claim 7, wherein the simulated node of each particular simulation platform implements an Open Systems Interconnection (OSI) model, the OSI model having layers one through seven, layer one of the OSI model being a physical layer receiver model.

9. The system of claim 8, wherein layers two through seven of the OSI model are configurable for executing a set of actual real-world networking software of the simulated entity represented by the particular simulation platform.

10. The system of claim 6, wherein each of the plurality of simulation platforms operates within a network simulator, and the plurality of simulation platforms are hosted on at least one computing device.

11. The system of claim 6, wherein the simulation control module is further configured for controlling mobility of each of the plurality of simulation platforms.

12. The system of claim 6, wherein the simulation control module is further configured for generating traffic flows in the network simulation.

13. A method for hosting a simulation platform on a computing device, the simulation platform representing an entity in a network simulation, the method comprising:
    defining a simulated node, the simulated node configured for executing a set of networking software for representing the entity in the network simulation;
    defining a communication handler, the communication handler configured for handling communications between the simulation platform and another simulation platform in the network simulation; and
    defining a proxy node, the proxy node configured for emulating a data transmission from the other simulation platform to the simulated node, wherein communications from the other simulation platform to the simulation platform comprises a set of spatial parameters, and the proxy node is positioned in the network simulation based on the set of spatial parameters received;
    wherein the simulated node comprises a receiver model, the proxy node comprises a transmitter model, and the simulated node only receives network communications via the proxy node.

14. The method of claim 13, wherein the simulated node implements an Open Systems Interconnection (OSI) model, the OSI model having layers one through seven, layer one of the OSI model being a physical layer receiver model, and layers two through seven of the OSI model are configurable for executing a set of actual real-world networking software of the entity.

15. The method of claim 13, wherein the simulation platform operates within a network simulator hosted on the computing device.

* * * * *